(12) United States Patent
Seo

(10) Patent No.: US 7,999,605 B2
(45) Date of Patent: Aug. 16, 2011

(54) VOLTAGE GENERATOR AND MEMORY DEVICE INCLUDING OF THE SAME

(75) Inventor: Sung Whan Seo, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 39 days.

(21) Appl. No.: 12/652,214

(22) Filed: Jan. 5, 2010

(65) Prior Publication Data

US 2010/0171544 A1 Jul. 8, 2010

(30) Foreign Application Priority Data

Jan. 7, 2009 (KR) .................. 10-2009-0001093

(51) Int. Cl.
*G05F 1/10* (2006.01)
(52) U.S. Cl. ..................................... 327/536
(58) Field of Classification Search .................. 327/535, 327/536, 537
See application file for complete search history.

(56) References Cited

U.S. PATENT DOCUMENTS

| | | | |
|---|---|---|---|
| 6,285,622 B1 * | 9/2001 | Haraguchi et al. ............ 365/226 |
| 6,724,242 B2 * | 4/2004 | Kim et al. ...................... 327/536 |
| 6,765,428 B2 * | 7/2004 | Kim et al. ...................... 327/534 |
| 7,274,248 B2 * | 9/2007 | Okamoto ....................... 327/536 |
| 7,339,829 B2 | 3/2008 | Sarig |
| 7,501,881 B2 * | 3/2009 | Youn et al. ..................... 327/536 |
| 7,567,118 B2 * | 7/2009 | Azuma et al. ................. 327/536 |
| 7,755,417 B2 * | 7/2010 | Suzuki .......................... 327/536 |

FOREIGN PATENT DOCUMENTS

| | | |
|---|---|---|
| JP | 09320268 A | 12/1997 |
| JP | 2004319044 A | 11/2004 |
| KR | 100264959 B1 | 6/2000 |

* cited by examiner

*Primary Examiner* — Jeffrey S Zweizig
(74) *Attorney, Agent, or Firm* — Volentine & Whitt, PLLC

(57) ABSTRACT

A voltage generator and a memory device including the voltage generator are provided. The voltage generator includes a clock generation unit which outputs a plurality of clock signals; a charge pumping unit which comprises a plurality of charge pumps, wherein one from among the plurality of charge pumps is enabled in response to an operation mode signal, and performs a charge pumping operation according to the plurality of clock signals to output a first voltage; and a regulator which generates a standby operation voltage from the first voltage.

18 Claims, 7 Drawing Sheets

VOLTAGE GENERATOR AND MEMORY DEVICE INCLUDING OF THE SAME

CROSS-REFERENCE TO RELATED APPLICATIONS

This application claims the benefit of Korean Patent Application No. 10-2009-0001093 filed on Jan. 7, 2009, the subject matter of which is hereby incorporated by reference.

BACKGROUND

The present inventive concept relates to a voltage generator and a memory device including same. More particularly, the inventive concept relates to a voltage generator capable of reducing current consumption and generating a stable voltage level, as well as a memory device including such a voltage generator.

Flash memories, which are non-volatile memories, may be classified into NOR type flash memories and NAND type flash memories according to the type of logic connection provided between each memory cell and a corresponding bitline. In general, NOR type flash memories are disadvantageous in applications demanding high integration density because they consume more current than NAND flash memories. However, NOR type flash memories better accommodate high speed operations.

More recently, multi level memory cells (MLCs) have been incorporated into flash memories in order to further increase integration density, i.e., data storage capacity per unit size are of the constituent memory device. However, flash memories including MLCs require highly stable (i.e., exhibiting very small voltage level variations) operating voltage(s) in order to properly program, erase, and read data. Such operating voltage(s) are routinely provided by voltage generation circuit(s).

Many conventional voltage generation circuits associated with flash memory devices include a plurality of charge pumps. The conventional voltage generation circuit intermittently drives all of the plurality of charge pumps even when the flash memory is in a standby state, thereby maintaining a constant output voltage level. As a result, the plurality of charge pumps needs to perform pumping operations even when the flash memory device is in a standby state so that a stable voltage may be readily applied to the constituent flash memory array and a rapid data readout achieved. During this process, the plurality of charge pumps may maintain an at least a desired constant voltage level by alternating between two closely associated voltage levels.

In other words, the plurality of charge pumps may be charged to a defined voltage level by performing a high-speed charge pumping operation to a higher voltage level, and then allowing the higher voltage level to settle back to the defined voltage level by means of charge leakage inherent in the circuit operations of the flash memory when the pumping operation is halted. Then, when the voltage returns to the defined voltage level, the plurality of charge pumps begins the pumping operation again. In this manner, the plurality of charge pumps provides a pumping operation that essentially alternates between two voltage levels. Unfortunately, the stability of this pumping operation is relatively low when the difference between the defined voltage and higher voltage is relatively large. And when the difference between these two voltages is reduced to improve stability of the provided voltage, the ON/OFF frequency of pumping operation must be increased during the standby state, thereby causing a corresponding increase in current consumption.

SUMMARY

Embodiments of the inventive concept provide a voltage generator capable of reducing current consumption while also generating a stable voltage level. Embodiments of the inventive concept also provide memory device including this type of voltage generator.

According to an aspect of the inventive concept, there is provided a voltage generator comprising; a clock generation unit configured to provide a plurality of clock signals including a first clock signal, a charge pumping unit comprising a plurality of charge pumps respectively performing charge pumping operations in response to one of the plurality of clock signals, wherein the plurality of charge pumps includes a first charge pump receiving the first clock signal and providing a first voltage, and other charge pumps other than the first charge pump, the first charge pump being enabled and the other charge pumps being disabled by a first operating mode signal received during a standby mode of operation to generate the first voltage, and each of the plurality of charge pumps being enabled by a second operating mode signal received during an active mode of operation to generate a second voltage; and a regulator configured to generate a standby operation voltage from the first voltage during the standby mode of operation.

According to another aspect of the inventive concept, there is provided a voltage generator comprising; a first clock generation unit configured to generate a plurality of first clock signals including a first clock signal, a second clock generation unit configured to generate a plurality of second clock signals having, respectively, longer cycle than corresponding one of the plurality of first clock signals, a charge pumping unit comprising a plurality of charge pumps respectively performing charge pumping operations in response to at least one of the first and second pluralities of clock signals, wherein the plurality of charge pumps includes a first charge pump receiving the first clock signal and providing a first voltage, and other charge pumps other than the first charge pump receiving either one of the first plurality of clock signals or one of the second plurality of clock signals, the first charge pump being enabled and the other charge pumps being disabled by a first operating mode signal received during a standby mode of operation to generate the first voltage, and each of the plurality of charge pumps being enabled by a second operating mode signal received during an active mode of operation to generate a second voltage, and a regulator configured to generate a standby operation voltage from the first voltage during the standby mode of operation.

According to another aspect of the inventive concept, there is provided a memory device comprising; a memory cell array including a plurality of memory cells, a decoder connected to the memory cell array, and a voltage generator connected to the decoder and configured to provide an operating voltage to at least one of the plurality of memory cells via the decoder. The voltage generator comprises; a clock generation unit configured to provide a plurality of clock signals including a first clock signal, a charge pumping unit comprising a plurality of charge pumps respectively performing charge pumping operations in response to one of the plurality of clock signals, wherein the plurality of charge pumps includes a first charge pump receiving the first clock signal and providing a first voltage, and other charge pumps other than the first charge pump, the first charge pump being enabled and the other charge pumps being disabled by a first operating mode signal received during a standby mode of operation to generate the first voltage, and each of the plurality of charge pumps being enabled by a second operating mode signal received during an active mode of operation to generate a second voltage; and a regulator configured to generate a standby operation voltage from the first voltage during the standby mode of operation.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF EMBODIMENTS

The inventive concept will now be described in relation to several embodiments. However, it will be noted that the inventive concept may be variously embodied and should not be construed as being limited to only the illustrated embodiments.

Figure 1:
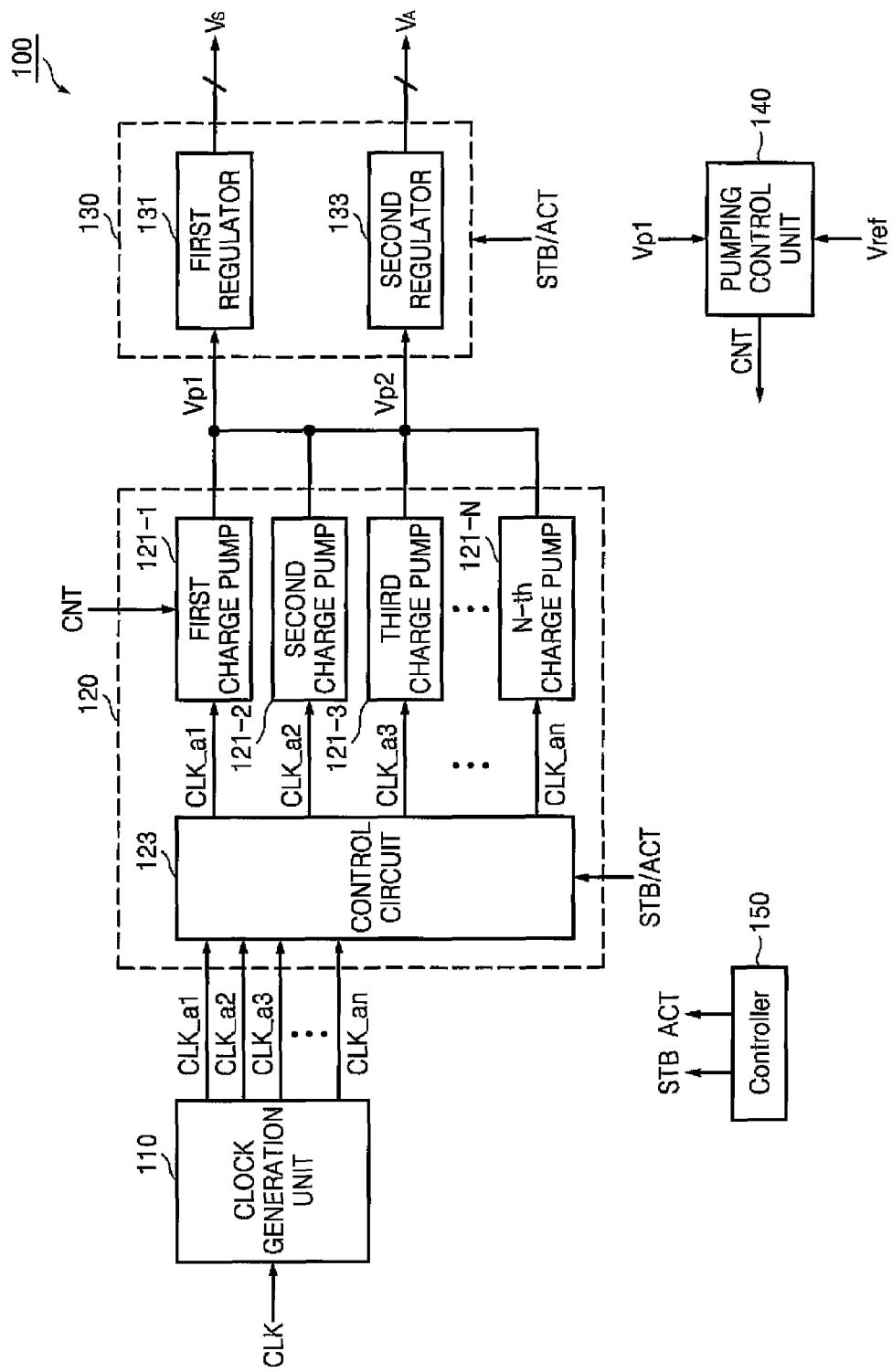
FIG. 1 is a schematic block diagram of a voltage generator according to an embodiment of the inventive concept.
Figure 2:
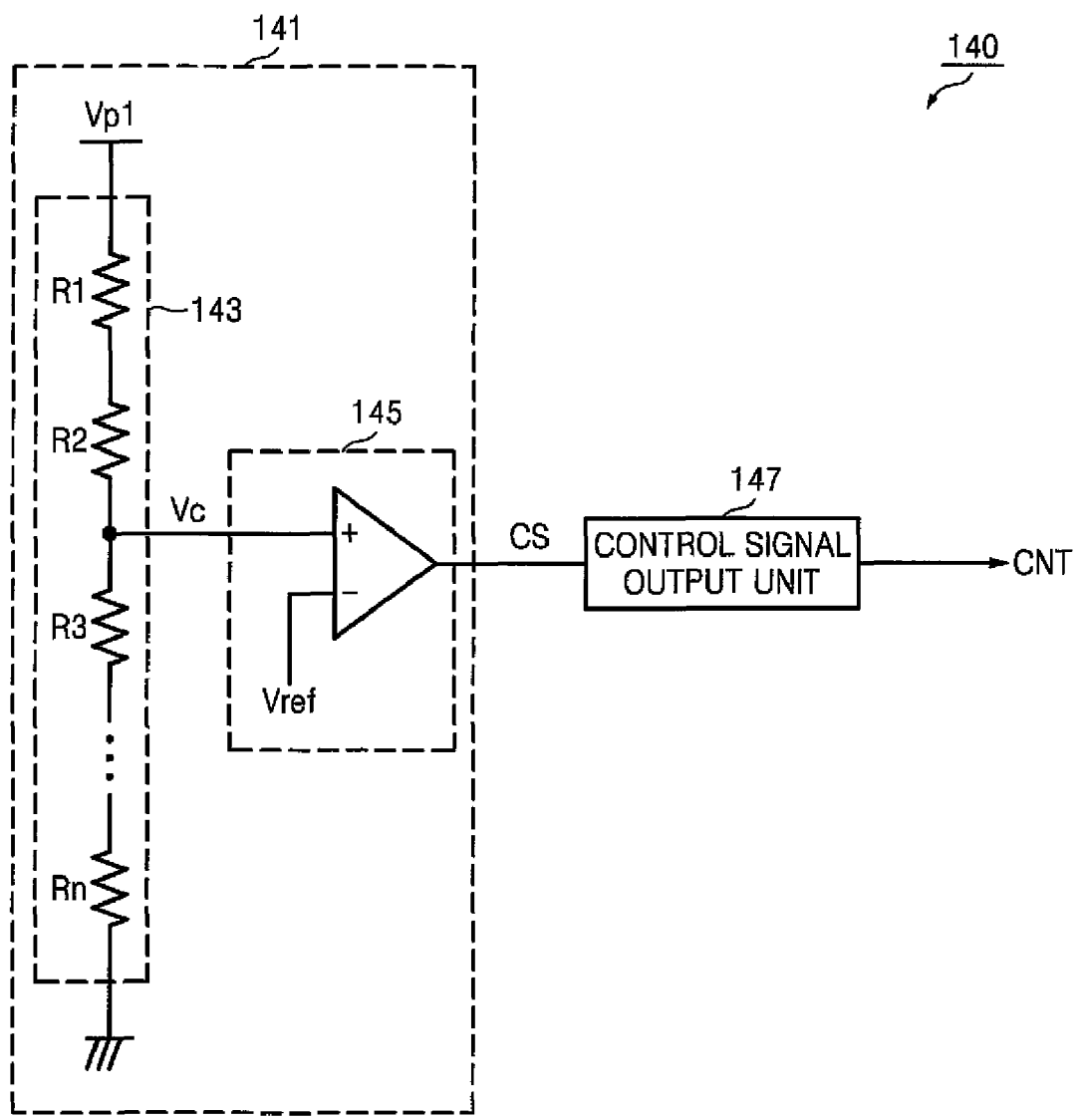
FIG. 2 is a schematic block diagram further illustrating the pumping control unit of the voltage generator of FIG. 1.

FIG. 1 is a schematic block diagram of a voltage generator 100 according to an embodiment of the inventive concept. FIG. 2 is a schematic block diagram further illustrating the pumping control unit 140 of voltage generator 100.

Referring to FIG. 1, the voltage generator 100 comprises a clock generation unit 110, a charge pumping unit 120, a regulator 130, and a pumping control unit 140.

The clock generation unit 110 generates a plurality of clock signals, for example, a plurality of first clock signals CLK_a1, CLK_a2, CLK_a3, . . . CLK_an, from an external clock signal CLK provided from an external source. Each of the first clock signals CLK_a1, CLK_a2, CLK_a3, . . . CLK_an may have a cycle longer than that of the external clock signal CLK, and may be delayed for a predetermined period of time before being output.

The charge pumping unit 120 comprises a plurality of charge pumps, (e.g., first through to N-th charge pumps 121_1, 121_2, 121_3, . . . 121_N), and a control circuit 123. The first through N-th charge pumps 121_1, 121_2, 121_3, . . . 121_N are respectively enabled or disabled by the control circuit 123, and perform charge pumping operations in response to one of the plurality of first clock signals CLK_a1, CLK_a2, CLK_a3, . . . CLK_an received from the clock generation unit 110.

The control circuit 123 enables one of the first through N-th charge pumps 121_1, 121_2, 121_3, . . . 121_N and disables the other first through N-th charge pumps 121_2, 121_3, . . . 121_N in response to a standby mode signal STB provided to the constituent memory device from an external source, (e.g., a controller 150).

For example, the first clock signal CLK_a1 from among the plurality of first clock signals CLK_a1, CLK_a2, CLK_a3, . . . CLK_an provided by the clock generation unit 110 may be provided to the first charge pump 121_1 via the control circuit 123. Accordingly, the enabled first charge pump 121_1 may perform a charge pumping operation according to the first clock signal CLK_a1.

When an active mode signal ACT—also externally provided to the constituent memory device from the controller 150—is applied to the control circuit 123, each and every one of the first through N-th charge pumps 121_1, 121_2, 121_3, . . . 121_N is enabled. The plurality of first clock signals CLK_a1, CLK_a2, CLK_a3, . . . CLK_an provided by the clock generation unit 110 may thus be collectively provided to the first through N-th charge pumps 121_1, 121_2, 121_3, . . . 121_N, respectively, via the control circuit 123. Accordingly, the first through N-th charge pumps 121_1, 121_2, 121_3, . . . 121_N may perform respective charge pumping operations in response to a corresponding one of the plurality of first clock signals CLK_a1, CLK_a2, CLK_a3, . . . CLK_an.

The standby mode signal STB or the active mode signal ACT output from the controller 150 may be generated as a clock signal. For example, if the clock signal is logic high, the controller 150 outputs the standby mode signal STB to the memory device. If the clock signal is logic low, the controller 150 outputs the active mode signal ACT to the memory device. The control circuit 123 of the charge pumping unit 120 may include a plurality of gate circuits (not shown) respectively enabling/disabling the first through N-th charge pumps 121_1, 121_2, 121_3, . . . 121_N according to various operating mode signals provided by the controller 150.

In the illustrated embodiment of FIG. 1, the regulator 130 comprises a first regulator 131 and a second regulator 133. The first regulator 131 is enabled in response to the standby mode signal STB provided by the controller 150. The second regulator 133 is enabled in response to the active mode signal ACT provided by the controller 150.

The first regulator 131 may be enabled in response to the standby mode signal STB and may regulate a first voltage Vp1 output from the first charge pump 121_1 of the charge pumping unit 120 in order to output a standby driving voltage Vs which is, for example, used in a standby operation mode of the memory device. The second regulator 133 may be enabled in response to the active mode signal ACT and may regulate a second voltage Vp2 output from each of the first through N-th charge pumps 121_1, 121_2, 121_3, . . . 121_N of the charge pumping unit 120 in order to output active driving voltages $V_A$ which are, for example, used in an active mode of the memory device.

The standby operation mode for the memory device may be a state in which the memory device performs one or more standby operation(s), and the active mode of the memory device may be a state in which the memory device performs normal data access operations such as read, write, and erase.

The pumping control unit 140 may enable/disable the first charge pump 121_1 according to the amplitude of the first voltage Vp1 provided by the first charge pump 121_1 of the charge pumping unit 120. For example, the pumping control unit 140 may compare the amplitude of the first voltage Vp1 with a reference voltage Vref, and generate a control signal CNT according to a result of the comparison. The control signal CNT provided by the pumping control unit 140 may be used to enable/disable the charge pumping operation of the first charge pump 121_1.

Referring now to FIGS. 1 and 2, the pumping control unit 140 may comprise a comparison unit 141 and a control signal output unit 147. The comparison unit 141 may include a voltage distribution unit 143 in which a plurality of resistors R1, R2, R3, . . . Rn are serially connected to one another, and a comparator 145 that compares a voltage output from the voltage distribution unit 143, for example, a comparison voltage Vc, with the reference voltage Vref.

The voltage distribution unit 143 may drop the first voltage Vp1 output from the first charge pump 121_1 by using some of the resistors R1, R2, R3, . . . Rn, for example, the resistors R1 and R2, to output a comparison voltage Vc of which voltage dropped. The comparator 145 may compare the comparison voltage Vc output from the voltage distribution unit 143 with the reference voltage Vref. If the comparison voltage Vc is less than or equal to the reference voltage Vref, the comparator 145 may output a comparison signal CS. The control signal output unit 147 may generate the control signal CNT from the comparison signal CS output from the comparator 145. The control signal CNT may be provided to the first charge pump 121_1 and control the charge pumping operation of the first charge pump 121_1.

Figure 3:
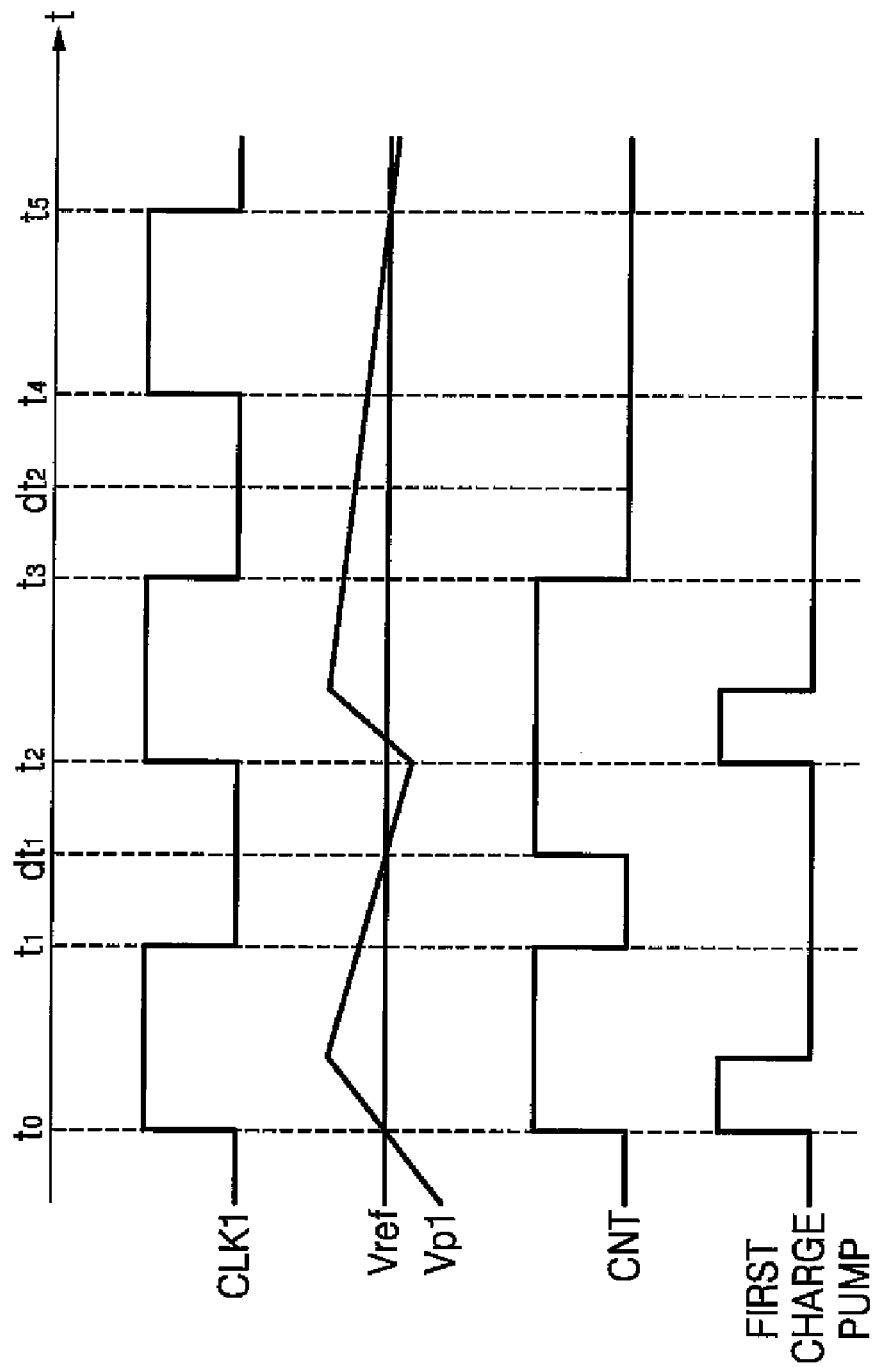
FIG. 3 is a waveform diagram further illustrating the operation of the voltage generator of FIG. 1.

An operation of the above-described voltage generator 100 will now be described with reference to FIG. 3. FIG. 3 is a waveform diagram further illustrating the operation of the voltage generator 100 of FIG. 1. Referring to FIGS. 1 and 3, the clock generation unit 110 is assumed to generate the first clock signal CLK_a1 having a cycle t0-t2 along the time axis (t).

The first charge pump 121_1 perform a primary charge pumping operation in response to the first clock signal CLK_a1 at time t0 to output the first voltage Vp1.

The pumping control unit 140 detects the amplitude of the first voltage Vp1 provided from the first charge pumping unit 121_1 during a detection period of operation, (e.g., the period during which the first clock signal CLK_a1 is low, or during the period t1 to t2). For example, if a first voltage Vp1 detected at the time dt1 is less than or equal to the reference voltage Vref, the pumping control unit 140 compares the first voltage Vp1 with the reference voltage Vref, and output the corresponding control signal CNT. The control signal CNT may then be output after a transition from low to high at a time dt1.

The control signal CNT output from the pumping control unit 140 is provided to the first charge pump 121_1. The first charge pump 121_1 then performs a secondary charge pumping operation according to the first clock signal CLK_a1 at time t2 by using the control signal CNT to output the first voltage Vp1. The pumping control unit 140 compares the first voltage Vp1 output from the first charge pump 121_1 with the reference voltage Vref during the period t3 to t4. If a first voltage Vp1 detected at a time dt2 is greater than the reference voltage Vref, the pumping control unit 140 will not output the control signal CNT. Accordingly, the first charge pump 121_1 will not perform a charge pumping operation at time t4.

Figure 4:
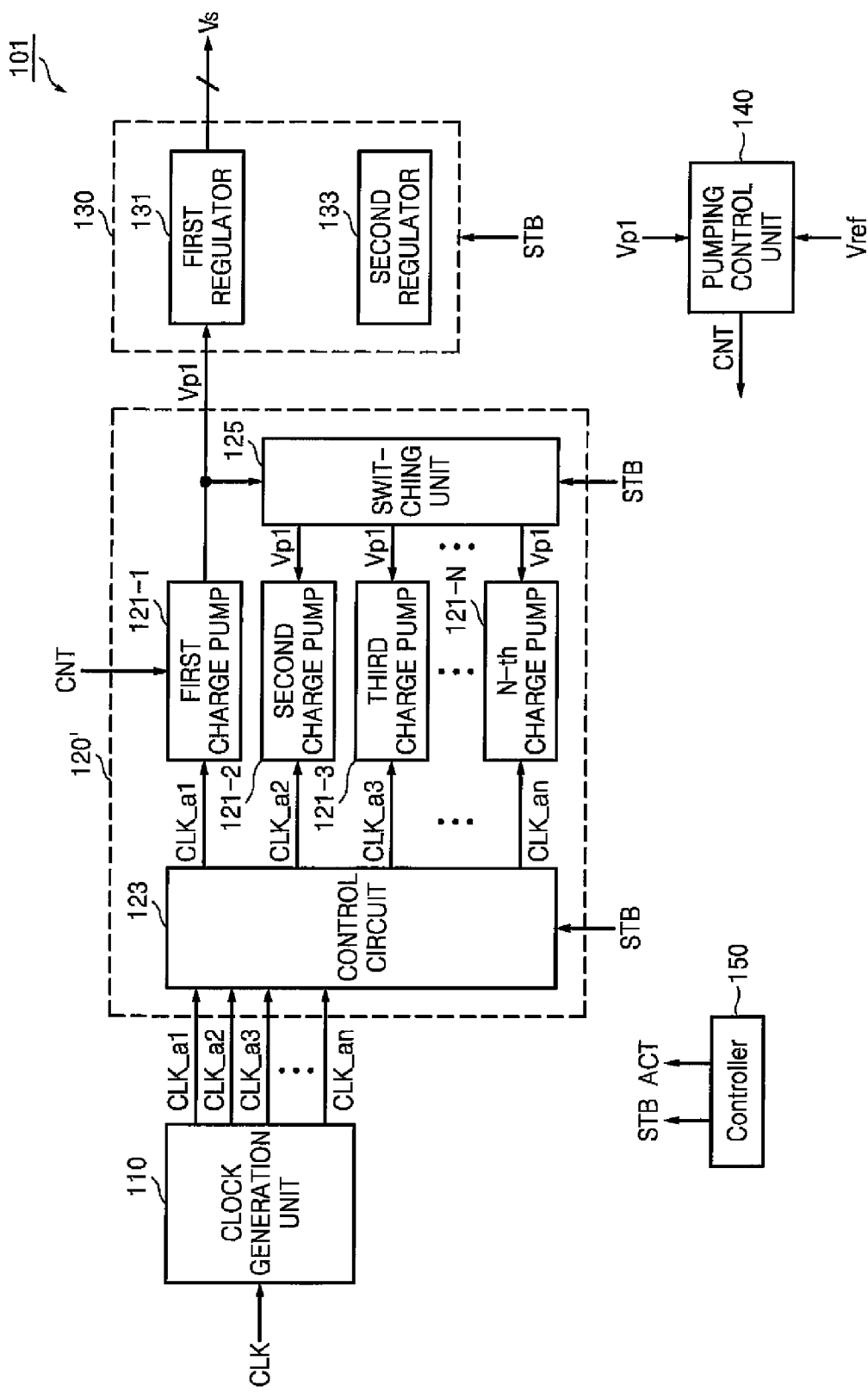
FIG. 4 is a schematic block diagram of a voltage generator according to another embodiment of the inventive concept.
Figure 5:
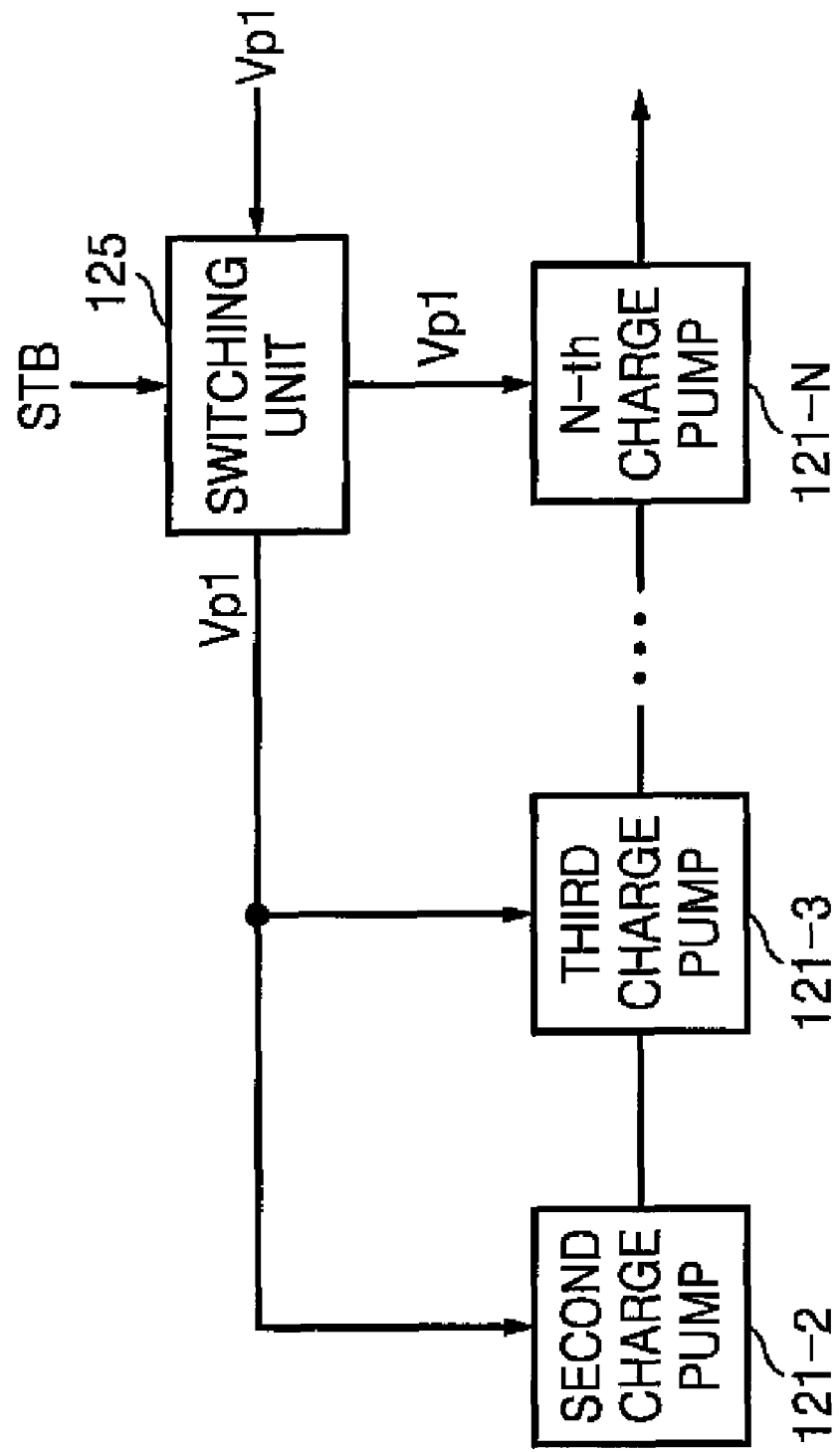
FIG. 5 is a schematic block diagram further illustrating the charge pumping unit of the voltage generator of FIG. 4.
Figure 6:
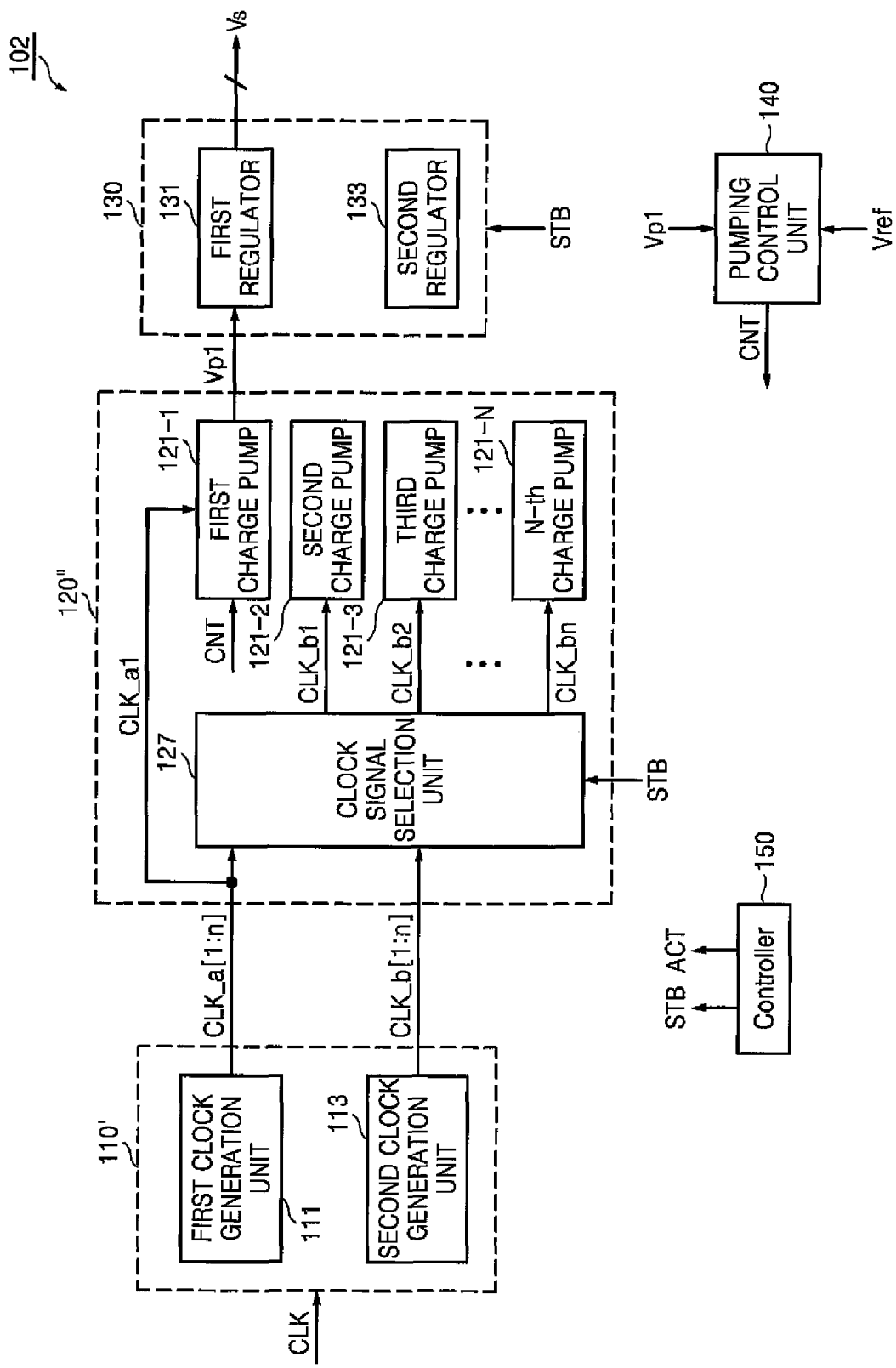
FIG. 6 is a schematic block diagram of a voltage generator according to another embodiment of the inventive concept.

FIG. 4 is a schematic block diagram of a voltage generator 101 according to another embodiment of the inventive concept. FIG. 5 is a schematic block diagram further illustrating the charge pumping unit 120' of voltage generator 101 of FIG. 4. FIG. 6 is a schematic block diagram of a voltage generator 102 according to another embodiment of the inventive concept. In these additional embodiments, for convenience of explanation, like elements and circuits previously described in relation to FIGS. 1 through 3 are similarly indicated by reference numbers and/or characters. Their descriptions will not be repeated in the following discussion of additional embodiments.

Referring to FIGS. 4 and 5, the voltage generator 101 comprises the clock generation unit 110, a charge pumping unit 120', the regulator 130, and the pumping control unit 140. The clock generation unit 110, the regulator 130, and the pumping control unit 140 are assumed to be the same as those described above with reference to FIGS. 1 through 3. However, the charge pumping unit 120' of the voltage generator 101 now comprises the control circuit 123, the first through N-th charge pumps 121_1, 121_2, 121_3, . . . 121_N, and a switching unit 125.

The control circuit 123 is again assumed to enable the first charge pump 121_1 among the first through N-th charge pumps 121_1, 121_2, 121_3, . . . 121_N in response to the standby mode signal STB provided by the controller 150 and disable the other charge pumps 121_2, 121_3, . . . 121_N.

The first charge pump 121_1 is enabled by the control circuit 123 and performs a charge pumping operation according to the first clock signal CLK_a1 from among the plurality of first clock signals CLK_a1, CLK_a2, CLK_a3, . . . CLK_an provided by the clock generation unit 110. The first charge pump 121_1 outputs the first voltage Vp1 to the regulator 130, and the first regulator 131 of the regulator 130 may generate a plurality of standby voltages Vs from the first voltage Vp1.

The switching unit 125 outputs the first voltage Vp1 received from the first charge pump 121_1 to each of the other charge pumps, for example, the second charge pump 121_2, the third charge pump 121_3, through to the N-th charge pump 121_N, in response to the standby mode signal STB.

For example, the second through N-th charge pumps 121_2, 121_3, . . . 121_N other than the first charge pump 121_1 may be serially connected to one another, and are disabled by the control circuit 123 and thus do not perform the charge pumping operation.

The switching unit 125 receives a voltage provided by the first charge pump 121_1, namely, the first voltage Vp1, and switch in response to the standby mode signal STB output from the controller 150. According to the switching operation of the switching unit 125, the first voltage Vp1 output from the first charge pump 121_1 may be provided to each of the other charge pumps 121_2, 121_3, . . . 121_N, and each of the other charge pumps 121_2, 121_3, . . . 121_N may be pre-charged. The charge pumping unit 120' may further include a capacitor (not shown) that allows each of the remaining charge pumps 121_2, 121_3, . . . 121_N to be precharged with the first voltage Vp1 provided by the switching unit 125.

Referring to FIG. 6, the voltage generator 100 comprises a clock generation unit 110', a charge pumping unit 120'', the regulator 130, and the pumping control unit 140. The regulator 130 and the pumping control unit 140 are assumed to be the same as those previously described with reference to FIGS. 1 through 3.

The clock generation unit 110' of the voltage generator 102 comprises a first clock generation unit 111 and a second clock generation unit 113. The first clock generation unit 111 generates the plurality of first clock signals CLK_a1, CLK_a2, CLK_a3, . . . CLK_an from the clock signal CLK provided from an external source, and the second clock generation unit 113 generates a plurality of second clock signals CLK_b1, CLK_b2, CLK_b3, . . . CLK_bn from the clock signal CLK provided from the external source.

The second clock signals CLK_b1, CLK_b2, CLK_b3, . . . CLK_bn may have cycles longer than those of the first clock signals CLK_a1, CLK_a2, CLK_a3, . . . CLK_an, (e.g., cycles approximately 100 times greater than those of the first clock signals CLK_a1, CLK_a2, CLK_a3, . . . CLK_an).

The charge pumping unit 120'' comprises a clock signal selection unit 127 and a plurality of charge pumps, namely, first through N-th charge pumps 121_1, 121_2, 121_3, . . . 121_N. The clock signal selection unit 127 may select and output either the first clock signals CLK_a1, CLK_a2, CLK_a3, ... CLK_an or the second clock signals CLK_b1, CLK_b2, CLK_b3, ... CLK_bn received from the clock generation unit 110'.

For example, the clock signal selection unit 127 may switch in response to the standby mode signal STB received from the controller 150 and may output the second clock signals CLK_b1, CLK_b2, CLK_b3, ... CLK_bn from among the first clock signals CLK_a1, CLK_a2, CLK_a3, ... CLK_an and the second clock signals CLK_b1, CLK_b2, CLK_b3, ... CLK_bn.

The first charge pump 121_1 from among the first, second, third through to N-th charge pumps 121_1, 121_2, 121_3, ... 121_N may receive the first clock signal CLK_a1 from among the first clock signals CLK_a1, CLK_a2, CLK_a3, ... CLK_an from the first clock generation unit 111, perform a charge pumping operation, and output the first voltage Vp1. The first voltage Vp1 output from the first charge pump 121_1 may be output as the plurality of standby voltages Vs via the first regulator 131.

Charge pumps other than the first charge pump 121_1, for example, the second charge pump 121_2, the third charge pump 121_3, through to the N-th charge pump 121_N, may receive the second clock signals CLK_b1, CLK_b2, CLK_b3, ... CLK_bn from the clock signal selection unit 127 and perform charge pumping operations. The second clock signals CLK_b1, CLK_b2, CLK_b3, ... CLK_bn may be output with cycles longer than those of the first clock signals CLK_a1, CLK_a2, CLK_a3, ... CLK_an, and thus the first, second, third through to N-th charge pumps 121_2, 121_3, ... 121_N other than the first charge pump 121_1 may perform slower charge pumping operations than that performed in the first charge pump 121_1.

In other words, in the embodiment illustrated in FIGS. 4 and 5, the voltage output from the first charge pump 121_1, namely, the first voltage Vp1, may be precharged in each of the other second, third through to N-th charge pumps 121_2, 121_3, ... 121_N. In the embodiment illustrated in FIG. 6, the other second, third through to N-th charge pumps 121_2, 121_3, ... 121_N perform charge pumping operations separately from the first charge pump 121_1. Therefore, if the memory device is in the standby mode for a long time, the first, second, third through to N-th charge pumps 121_1, 121_2, 121_3, ... 121_N of the charge pumping unit 120' or 120" may be prevented from outputting reduced voltage levels.

Figure 7:
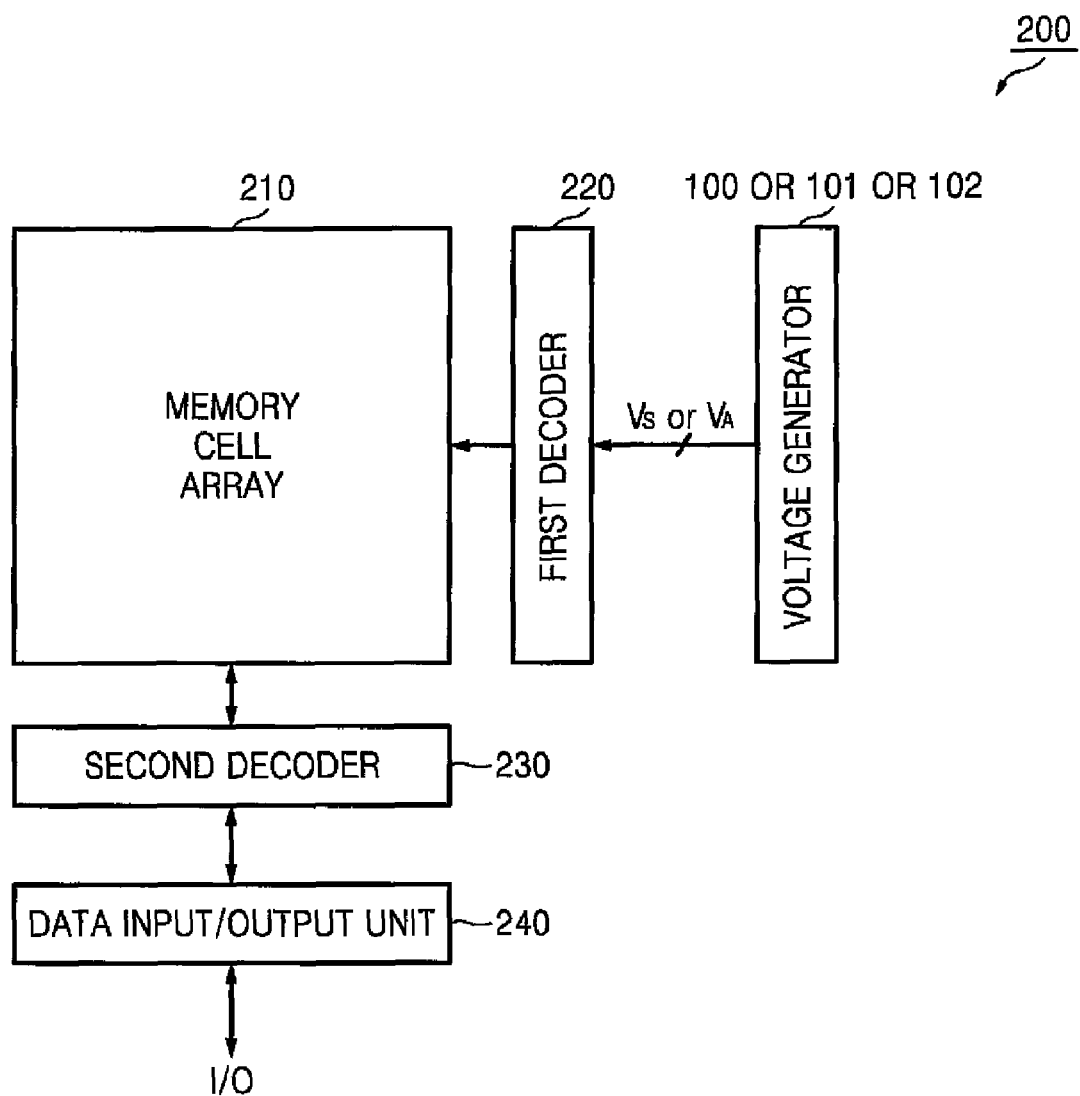
FIG. 7 is a schematic block diagram of a memory device according to an embodiment of the inventive concept.

FIG. 7 is a schematic block diagram of a memory device 200 according to an embodiment of the inventive concept. Referring to FIG. 7, the memory device 200 comprises a memory cell array 210, a first decoder 220, a second decoder 230, a data input/output unit 240, and a voltage generator (any one of 100, 101, or 102 from the previous examples). The memory cell array 210 includes a plurality of memory cells arranged in a matrix defined by a plurality of rows (wordlines) and a plurality of columns (bitlines).

The first decoder 220 selects at least one from the plurality of wordlines and provides one from among a plurality of operating voltages provide by the voltage generator 100, 101, or 102, (e.g., either the plurality of standby voltages Vs or the plurality of active voltages $V_A$) to the selected wordline. The second decoder 230 selects one bit line connected to a memory cell to be programmed (or read) from among a plurality of memory cells connected to the selected wordline.

The data input/output unit 240 receives data from an external source and performs a write (or program) operation to the memory cell selected by the second decoder 230, or performs a read operation for data retrieved from the memory cell selected by the second decoder 230. The voltage generator 100, 101, or 102 generates at least one voltage (e.g., the plurality of standby voltages Vs or the plurality of active voltages $V_A$) according to the operating mode of the memory device 200, (e.g., a standby operation mode or an active mode).

For example, the voltage generator 100, 101, or 102 may provide the plurality of standby voltages Vs or the plurality of active voltages $V_A$ to the memory cell array 210 via the first decoder 220.

Although a voltage generator included in a NOR type flash memory has been illustrated in a convenient illustrative context, the other memory types may be modified to incorporate a voltage generator consistent with an embodiment of the inventive concept. In other words, voltage generators according to embodiments of the inventive concept may be included within not only NAND type flash memory devices, but also various types of non-volatile memory devices, for example, MASK ROMs (MROMs), Programmable ROMs (PROMs), Erasable and Programmable ROMs (EPROMs), Electrically Erasable and Programmable ROMs (EEPROMs), etc.

According to a voltage generator and a memory device including the same according to an embodiment of the inventive concept, only one charge pump of the voltage generator operates during a standby operation mode of the memory device, thereby ensuring the voltage stability of the memory device. In addition, the number of charge pumps that perform pumping operations during the standby operation mode of the memory device, thereby reducing current consumption of the voltage generator. Moreover, the other charge pumps of the voltage generator are intermittently driven to thereby prevent a voltage level reduction from being caused as the standby state of the memory device continues. Therefore, when the memory device is switched from the standby operation mode to an active mode, the driving speed may increase.

While the present inventive concept has been particularly shown and described with reference to exemplary embodiments thereof, it will be understood that various changes in form and details may be made therein without departing from the scope of the following claims.

What is claimed is:

1. A voltage generator comprising:
a clock generation unit configured to provide a plurality of clock signals including a first clock signal;
a charge pumping unit comprising a plurality of charge pumps respectively performing charge pumping operations in response to one of the plurality of clock signals, wherein the plurality of charge pumps includes a first charge pump receiving the first clock signal and providing a first voltage, and other charge pumps other than the first charge pump,
the first charge pump being enabled and the other charge pumps being disabled by a first operating mode signal received during a standby mode of operation to generate the first voltage, and
each of the plurality of charge pumps being enabled by a second operating mode signal received during an active mode of operation to generate a second voltage; and
a regulator configured to generate a standby operation voltage from the first voltage during the standby mode of operation.

2. The voltage generator of claim 1, wherein the voltage generator further comprises:
a pumping control unit configured to enable/disable the first charge pump in response to an amplitude of the first voltage.

3. The voltage generator of claim 2, wherein the pumping control unit comprises:
a comparison unit configured to compare the first voltage with a reference voltage and provide a comparison signal according to the comparison result; and
a control signal output unit configured to output a control signal controlling operation of the first charge pump in response to the comparison signal.

4. The voltage generator of claim 3, wherein the comparison unit compares the first voltage with the reference voltage during a half-cycle of the first clock signal, and outputs the comparison signal when the first voltage is less than or equal to the reference voltage.

5. The voltage generator of claim 1, wherein the charge pumping unit further comprises a control circuit configured to receive the first and second operating mode signals, receive the plurality of clocks signals, and apply selected one of the plurality of clock signals to the plurality of charge pumps in response to the first and second operating mode signals.

6. The voltage generator of claim 1, wherein the regulator comprises a first regulator receiving the first voltage and a second regulator receiving the second voltage and is configured to provide the standby voltage from the first regulator in response to the first operating mode signal, and provide an active voltage from the second regulator in response to the second operating mode signal.

7. The voltage generator of claim 5, wherein the charge pumping unit further comprises a switching unit configured to receive the first voltage and precharge the other charge pumps with the first voltage in response to the first operating mode signal.

8. The voltage generator of claim 7, wherein the other charge pumps are serially connected and collectively disabled by the control circuit during a precharge period.

9. A voltage generator comprising:
a first clock generation unit configured to generate a plurality of first clock signals including a first clock signal;
a second clock generation unit configured to generate a plurality of second clock signals having, respectively, longer cycle than corresponding one of the plurality of first clock signals;
a charge pumping unit comprising a plurality of charge pumps respectively performing charge pumping operations in response at least one of the first and second pluralities of clock signals,
wherein the plurality of charge pumps includes a first charge pump receiving the first clock signal and providing a first voltage, and other charge pumps other than the first charge pump receiving either one of the first plurality of clock signals or one of the second plurality of clock signals,
the first charge pump being enabled and the other charge pumps being disabled by a first operating mode signal received during a standby mode of operation to generate the first voltage, and
each of the plurality of charge pumps being enabled by a second operating mode signal received during an active mode of operation to generate a second voltage; and
a regulator configured to generate a standby operation voltage from the first voltage during the standby mode of operation.

10. The voltage generator of claim 9, wherein the charge pumping unit further comprises a clock signal selection unit configured to provide either the plurality of first clock signals or the plurality of second clock signals to the other charge pumps, respectively, in response to the first operating mode signal.

11. The voltage generator of claim 9, wherein the voltage generator further comprises:
a pumping control unit configured to enable/disable the first charge pump in response to an amplitude of the first voltage.

12. The voltage generator of claim 11, wherein the pumping control unit comprises:
a comparison unit configured to compare the first voltage with a reference voltage and provide a comparison signal according to the comparison result; and
a control signal output unit configured to output a control signal controlling operation of the first charge pump in response to the comparison signal.

13. The voltage generator of claim 12, wherein the comparison unit compares the first voltage with the reference voltage during a half-cycle of the first clock signal, and outputs the comparison signal when the first voltage is less than or equal to the reference voltage.

14. The voltage generator of claim 9, wherein the charge pumping unit further comprises a control circuit configured to receive the first and second operating mode signals, receive the plurality of clocks signals, and apply selected one of the plurality of clock signals to the plurality of charge pumps in response to the first and second operating mode signals.

15. A memory device comprising:
a memory cell array including a plurality of memory cells;
a decoder connected to the memory cell array; and
a voltage generator connected to the decoder and configured to provide an operating voltage to at least one of the plurality of memory cells via the decoder,
wherein the voltage generator comprises:
a clock generation unit configured to provide a plurality of clock signals including a first clock signal;
a charge pumping unit comprising a plurality of charge pumps respectively performing charge pumping operations in response to one of the plurality of clock signals,
wherein the plurality of charge pumps includes a first charge pump receiving the first clock signal and providing a first voltage, and other charge pumps other than the first charge pump,
the first charge pump being enabled and the other charge pumps being disabled by a first operating mode signal received during a standby mode of operation to generate the first voltage, and
each of the plurality of charge pumps being enabled by a second operating mode signal received during an active mode of operation to generate a second voltage; and
a regulator configured to generate a standby operation voltage from the first voltage during the standby mode of operation.

16. The memory device of claim 15, wherein the voltage generator further comprises:
a pumping control unit configured to enable/disable the first charge pump in response to an amplitude of the first voltage.

17. The memory device of claim 16, wherein the pumping control unit comprises:
a comparison unit configured to compare the first voltage with a reference voltage and provide a comparison signal according to the comparison result; and a control signal output unit configured to output a control signal controlling operation of the first charge pump in response to the comparison signal.

18. The memory device of claim 17, wherein the comparison unit compares the first voltage with the reference voltage during a half-cycle of the first clock signal, and outputs the comparison signal when the first voltage is less than or equal to the reference voltage.

* * * * *